(12) United States Patent
Lei et al.

(10) Patent No.: US 7,871,857 B1
(45) Date of Patent: Jan. 18, 2011

(54) METHODS OF FORMING MULTI-CHIP SEMICONDUCTOR SUBSTRATES

(75) Inventors: Kuolung Lei, San Jose, CA (US);
Harmeet Bhugra, San Jose, CA (US)

(73) Assignee: Integrated Device Technology, inc., San Jose, CA (US)

( * ) Notice: Subject to any disclaimer, the term of this patent is extended or adjusted under 35 U.S.C. 154(b) by 156 days.

(21) Appl. No.: 12/240,292

(22) Filed: Sep. 29, 2008

(51) Int. Cl.
*H01L 21/00* (2006.01)
*H01L 23/02* (2006.01)
*H05K 1/14* (2006.01)

(52) U.S. Cl. .......... 438/107; 438/109; 438/113; 438/458; 438/459; 438/462; 257/686; 257/724; 257/777; 361/784; 361/79; 361/792

(58) Field of Classification Search .......... None
See application file for complete search history.

(56) References Cited

U.S. PATENT DOCUMENTS

| | | | |
|---|---|---|---|
| 6,338,980 B1 | 1/2002 | Satoh | |
| 6,586,831 B2 | 7/2003 | Gooch et al. | |
| 6,667,225 B2 | 12/2003 | Hau-Riege et al. | |
| 6,676,491 B2 | 1/2004 | Arai et al. | |
| 6,777,267 B2 | 8/2004 | Ruby et al. | |
| 6,890,836 B2 | 5/2005 | Howard et al. | |
| 7,026,189 B2 | 4/2006 | Chen et al. | |
| 7,151,045 B2 | 12/2006 | Kim et al. | |
| 7,199,449 B2 | 4/2007 | Lake | |
| 7,335,576 B2 | 2/2008 | David et al. | |
| 7,754,581 B2* | 7/2010 | Ikeda et al. | 438/455 |
| 2003/0022465 A1* | 1/2003 | Wachtler | 438/462 |

FOREIGN PATENT DOCUMENTS

EP 1 154 474 A1 11/2001

OTHER PUBLICATIONS

"Wafer dicing," http://en.wikipedia.org/wiki/Wafer_dicing, printed Aug. 11, 2008, 1 page, Admitted Prior Art.
"Solutions for Wafer Singulation," http://www.aerotech.com/EMTI/wafersing.html, printed Aug. 11, 2008, 1 page, Admitted Prior Art.

* cited by examiner

*Primary Examiner*—Alonzo Chambliss
(74) *Attorney, Agent, or Firm*—Myers Bigel, et al (57) ABSTRACT

Methods of forming multi-chip semiconductor substrates include forming a first plurality of dicing streets in a first surface of a first semiconductor wafer having a first plurality of bonding sites thereon and forming a second plurality of dicing streets in a first surface of a second semiconductor wafer having a second plurality of bonding sites thereon. The first surfaces of the first and second semiconductor wafers are bonded together so that the first plurality of dicing streets are aligned with the second plurality of dicing streets and the first plurality of bonding sites are matingly received and permanently affixed within the second plurality of bonding sites. A plurality of bonded pairs of semiconductor chips are then formed by planarizing the second surface of the second semiconductor wafer until the second plurality of dicing streets are exposed.

15 Claims, 7 Drawing Sheets

METHODS OF FORMING MULTI-CHIP SEMICONDUCTOR SUBSTRATES

FIELD OF THE INVENTION

The present invention relates to integrated circuit fabrication methods and, more particularly, to methods of fabricating integrated circuit substrates.

BACKGROUND OF THE INVENTION

Conventional integrated circuit fabrication techniques have utilized multi-chip semiconductor substrates to increase integration density of electronic circuits within packaged integrated circuit devices. In addition to increasing integration density, multi-chip semiconductor substrates may improve device performance by reducing signal line delays and other parasitics associated with chip-to-chip electrical interconnects when mounted in a single integrated circuit package. Conventional techniques to form multi-chip substrates frequently include bonding multiple semiconductor chips together to form a substrate stack. For example, one conventional multi-chip fabrication technique is disclosed in U.S. Pat. No. 6,667,225 to Hau-Riege et al., entitled "Wafer-Bonding Using Solder and Method of Making the Same." The '225 patent discloses forming a two-wafer stack by solder bonding a first plurality of metallized trenches within a first wafer to a second plurality of metallized trenches within a second wafer. Another multi-chip fabrication technique, which is disclosed in U.S. Pat. No. 6,586,831 to Gooch et al., entitled "Vacuum Package Fabrication of Integrated Circuit Components," describes mating a device wafer to a lid wafer using aligned sealing rings on both wafers and then dicing the joined wafers into individual dies.

Conventional multi-chip fabrication techniques may also utilize electrically conductive "through-substrate" connection vias to support chip-to-chip bonding. Such techniques are disclosed in U.S. Pat. No. 7,276,799 to Lee et al., entitled "Chip Stack Package and Manufacturing Method Thereof." Related multi-chip fabrication techniques are also disclosed in U.S. Pat. Nos. 6,607,938 and 6,566,232.

SUMMARY OF THE INVENTION

Methods of forming multi-chip semiconductor substrates according to embodiments of the present invention include bonding a first semiconductor substrate having a first plurality of bonding sites thereon to a second semiconductor substrate having a second plurality of bonding sites thereon. This bonding step is performed by aligning the first plurality of bonding sites within corresponding ones of the second plurality of bonding sites and then treating the first and second pluralities of bonding sites so that each of the first plurality of bonding sites becomes permanently affixed within a corresponding one of the second plurality of bonding sites. According to some of these embodiments of the invention, each of the first plurality of bonding sites is configured to be matingly received within a corresponding one of the second plurality of bonding sites during the step to align the first plurality of bonding sites within corresponding ones of the second plurality of bonding sites.

According to additional embodiments of the invention, each of the first plurality of bonding sites includes a bonding site extension and each of the second plurality of bonding sites includes a bonding site recess into which a corresponding bonding site extension is received during the step of aligning the first plurality of bonding sites within corresponding ones of the second plurality of bonding sites. In addition, each bonding site extension within the first plurality of bonding sites may include a thermally malleable electrical conductor at a distal end thereof. This thermally malleable electrical conductor may be a solder material. According to additional embodiments of the invention, each bonding site extension may include a fusible metal alloy having a melting point in a range from about 90° C. to about 450° C. Moreover, each of the bonding site recesses in the second plurality of bonding sites may include a cylindrically-shaped metal receiver that is configured to receive a bonding side extension from a corresponding one of the first plurality of bonding sites. In particular, each of the first plurality of bonding sites may have a T-shaped cross-section and each of the second plurality of bonding sites may have a U-shaped cross-section.

Methods of forming multi-chip semiconductor substrate according to additional embodiments of the invention include bonding a first semiconductor wafer having a first plurality of bonding sites on a first surface thereof to a second semiconductor wafer having a second plurality of bonding sites on a first surface thereof. This bonding step is performed by aligning the first plurality of bonding sites in mating relationship with corresponding ones of the second plurality of bonding sites and then treating the first and second pluralities of bonding sites so that each of the first plurality of bonding sites becomes permanently affixed to a corresponding one of the second plurality of bonding sites. An additional bonding step is also performed. During this bonding step, the second semiconductor wafer, which also has a third plurality of bonding sites on a second surface thereof, is bonded to a third semiconductor wafer, which has a fourth plurality of bonding sites on a first surface thereof. This bonding step is performed by aligning the third plurality of bonding sites in mating relationship with corresponding ones of the fourth plurality of bonding sites and then treating the third and fourth pluralities of bonding sites so that each of the third plurality of bonding sites becomes permanently affixed to a corresponding one of the fourth plurality of bonding sites. According to these embodiments of the invention, the first and third plurality of bonding sites may have equivalent shape and the second and fourth plurality of bonding sites may have equivalent shape.

According to still further embodiments of the present invention, a method of forming multi-chip semiconductor substrates includes forming a first plurality of intersecting dicing streets in a first surface of a first semiconductor wafer and forming a second plurality of intersecting dicing streets in a first surface of a second semiconductor wafer. These dicing streets may have widths less than about 15 µm. The first surface of the first semiconductor wafer is bonded to the first surface of the second semiconductor wafer so that the first and second plurality of intersecting dicing streets are aligned with each other. Portions of a second surface of the second semiconductor wafer are then removed to expose bottoms of the second plurality of intersecting dicing streets, and thereby separate the bonded first and second semiconductor wafers into a plurality of bonded pairs of semiconductor chips.

This step of removing portions of the second surface of the second semiconductor wafer may be preceded by planarizing a second surface of the first semiconductor wafer to a sufficient depth to expose bottoms of the first plurality of intersecting dicing streets. These methods may also include forming a third plurality of intersecting dicing streets in a first surface of a third semiconductor wafer and then bonding the first surface of the third semiconductor wafer to the planarized second surface of the first semiconductor wafer so that the first and third plurality of intersecting dicing streets are aligned with each other. A second surface of the third semiconductor wafer is also planarized to a sufficient depth to expose bottoms of the third plurality of intersecting dicing streets.

DETAILED DESCRIPTION OF PREFERRED EMBODIMENTS

The present invention will now be described more fully herein with reference to the accompanying drawings, in which preferred embodiments of the invention are shown. This invention may, however, be embodied in many different forms and should not be construed as being limited to the embodiments set forth herein; rather, these embodiments are provided so that this disclosure will be thorough and complete, and will fully convey the scope of the invention to those skilled in the art. Like reference numerals refer to like elements throughout.

Figure 1A:
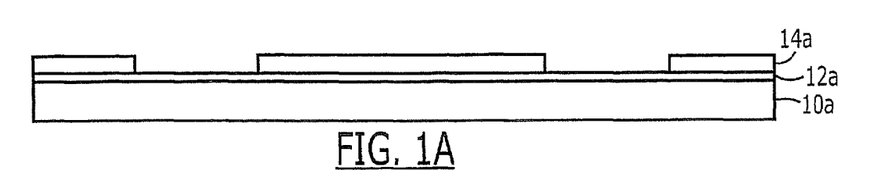
FIGS. 1A-1H are cross-sectional views of intermediate structures that illustrate methods of forming a first semiconductor substrate, according to embodiments of the present invention.

Methods of forming multi-chip semiconductor substrates according to embodiments of the present invention include forming a first semiconductor substrate having a first plurality of bonding sites thereon. As illustrated by FIGS. 1A-1H, a first plurality of bonding sites may be formed on a first semiconductor substrate by depositing a first metal seed layer 12a on a first surface of a first semiconductor wafer 10a. This first metal seed layer 12a, which may have a thickness in a range from about 100 Å to about 10,000 Å, may be formed of a metal selected from a group consisting of Ti, TiW, TiWN, Cr, Cu and Au and alloys and combinations thereof. As illustrated by FIG. 1A, a first plating template 14a is formed on the first metal seed layer 12a by depositing a photoresist layer having a thickness in a range from about 10,000 Å to about 100 µm directly on an upper surface of the first metal seed layer 12a and then photolithographically patterning the photoresist layer to define a plurality of openings therein that expose the underlying first metal seed layer 12a. This plurality of openings may be a two-dimensional array of regularly arranged circular openings, such as a two-dimensional array of openings arranged in a plurality of rows and columns. Alternative shapes and spacings of openings may also be provided.

Figure 1B:
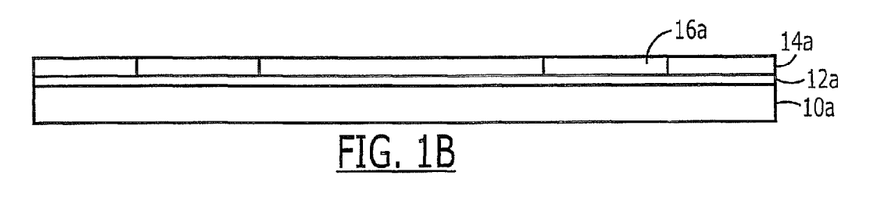
Figure 1C:
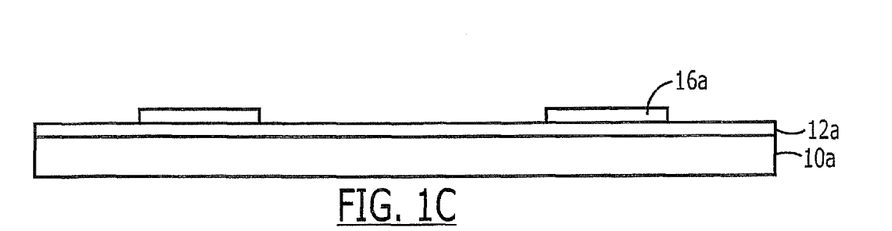
Figure 1D:
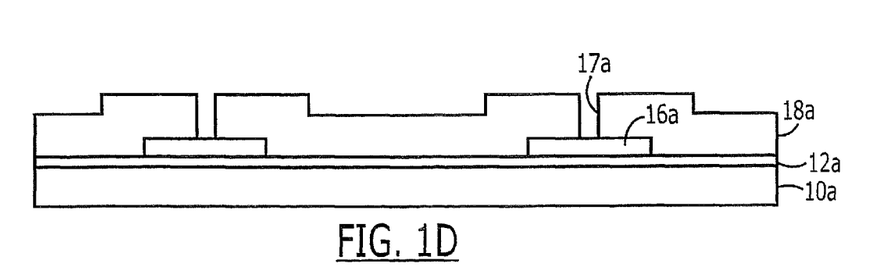

As illustrated by FIGS. 1B-1C, a first electroplating step is then performed to define a plurality of first bonding site platforms 16a on the first metal seed layer 12a. During this first electroplating step, the first metal seed layer 12a is used as an electroplating electrode to define first bonding site platforms 16a formed of a metal such as copper (Cu) or gold (Au), for example. The first plating template 14a is then removed. As illustrated by FIG. 1D, a second plating template 18a is then formed on the first metal seed layer 12a and on the first bonding site platforms 16a, by depositing a photoresist layer having a thickness in a range from about 10,000 Å to about 100 µm directly on the upper surface of the first metal seed layer 12a and on the first bonding site platforms 16a. This deposited photoresist layer is then photolithographically patterned to define openings 17a therein that expose the underlying first bonding site platforms 16a.

Figure 1E:
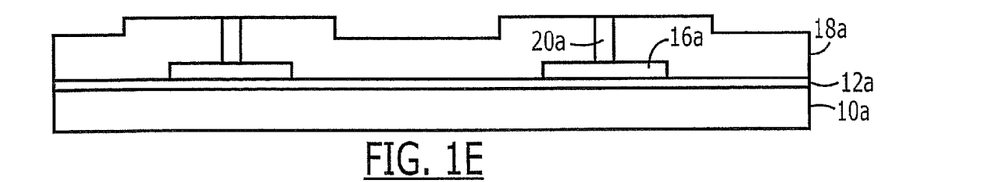
Figure 1F:
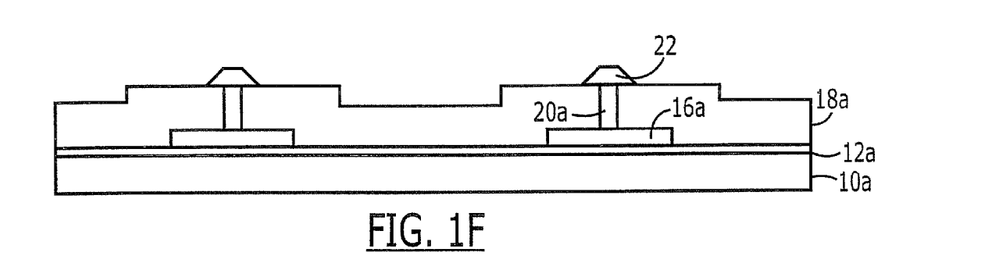

Referring now to FIG. 1E, a second electroplating step is then performed to define a plurality of first bonding site extensions 20a, which may be formed of the same material as the first bonding site platforms 16a. These first bonding site extensions 20a may have a height in a range from 1 µm to 100 µm. During this second electroplating step, the first metal seed layer 12a and the first bonding site platforms 16a are collectively used as an electroplating electrode. Thereafter, as illustrated by FIG. 1F, thermally malleable electrical conductors 22 are formed (e.g., deposited) on distal ends of the plurality of first bonding site extensions 20a. These thermally malleable electrical conductors may be formed of a solder material or another fusible metal alloy having a melting point in a range from about 90° C. to about 450° C.

Figure 1G:
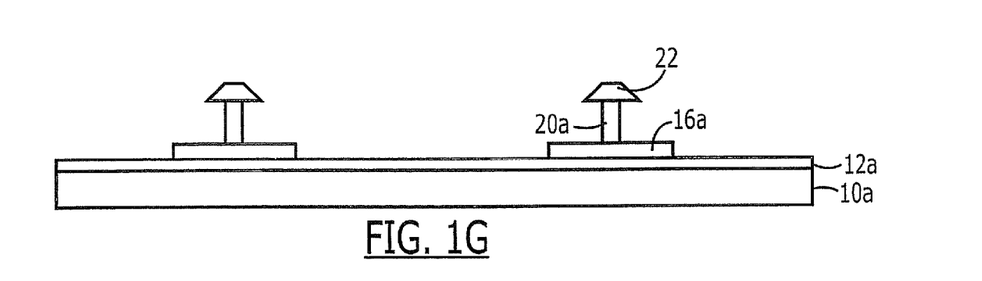
Figure 1H:
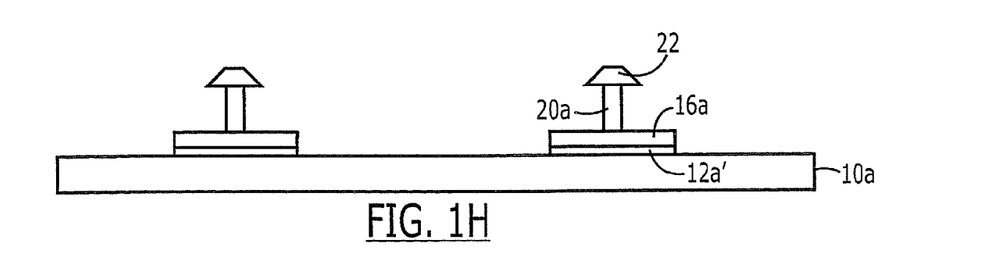

Referring now to FIGS. 1G-1H, the second plating template 18a is removed to expose the underlying first metal seed layer 12a. Exposed portions of the first metal seed layer 12a are then selectively removed (i.e., stripped) to expose the underlying surface of the first semiconductor wafer 10a and define first metal seed layer patterns 12a' and a first plurality of bonding sites (regions 16a, 20a and 22) thereon. For example, in the event the first metal seed layer is formed as a TiW layer, a hydrogen peroxide ($H_2O_2$) stripping process may be used to remove exposed portions of the first metal seed layer.

Figure 2A:
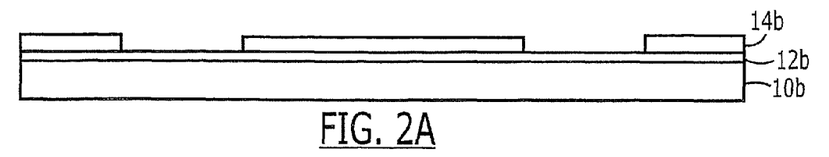
FIGS. 2A-2F are cross-sectional views of intermediate structures that illustrate methods of forming a second semiconductor substrate, according to embodiments of the present invention.

Referring now to FIGS. 2A-2H, a second plurality of bonding sites may be formed on a second semiconductor substrate by depositing a second metal seed layer 12b on a first surface of a second semiconductor wafer 10b. This second metal seed layer 12b, which may have a thickness in a range from about 100 Å to about 10,000 Å, may include a metal selected from a group consisting of Ti, TiW, TiWN, Cr, Cu and Au and alloys and combinations thereof. As illustrated by FIG. 2A, a third plating template 14b is formed on the second metal seed layer 12b by depositing a photoresist layer having a thickness in a range from about 10,000 Å to about 100 µm directly on an upper surface of the second metal seed layer 12b and then photolithographically patterning the photoresist layer to define a plurality of openings therein that expose the underlying second metal seed layer 12b. This plurality of openings may be arranged as a two-dimensional array of circular openings having a plurality of rows and columns therein, however, other shapes and spacings of openings may also be provided.

Figure 2B:
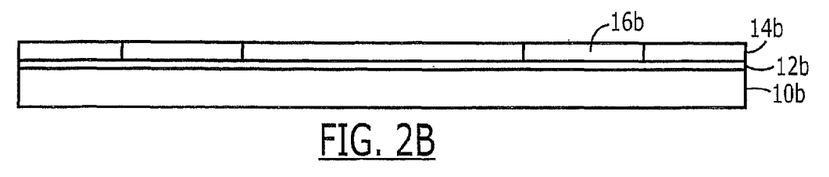
Figure 2C:
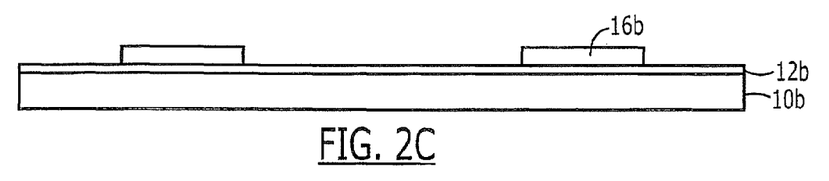
Figure 2D:
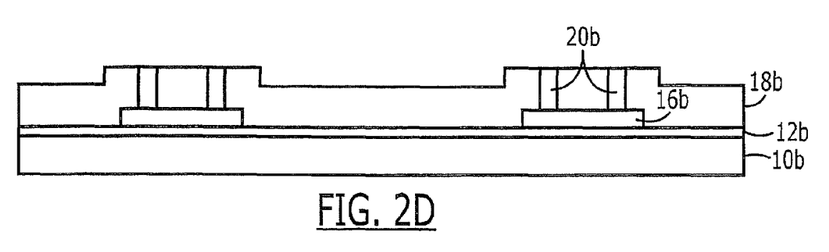

As illustrated by FIGS. 2B-2C, a third electroplating step is then performed to define a plurality of second bonding site platforms 16b on the second metal seed layer 12b. During this third electroplating step, the second metal seed layer 12b is used as an electroplating electrode. The third plating template 14b is then removed. As illustrated by FIG. 2D, a fourth plating template 18b is formed on the second metal seed layer 12b and on the second bonding site platforms 16b, by depositing a photoresist layer having a thickness in a range from about 10,000 Å to about 100 µm directly on the upper surface of the second metal seed layer 12b and on the second bonding site platforms 16b. This deposited layer is then photolithographically patterned to define openings (e.g., ring-shaped openings) therein that expose the underlying second bonding site platforms 16b.

Figure 2E:
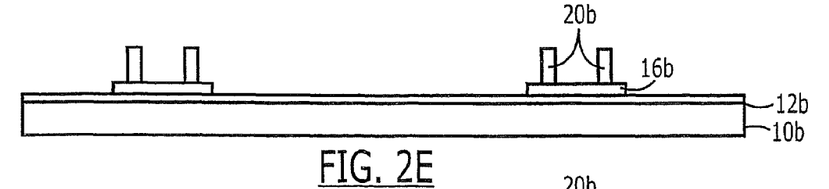
Figure 2F:
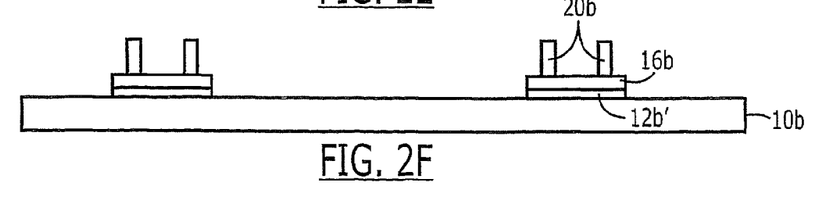

A fourth electroplating step is then performed to define a plurality of second bonding site extensions 20b, which may be cylindrically-shaped extensions formed of the same material as the second bonding site platforms 16b. During this fourth electroplating step, the second metal seed layer 12b and the second bonding site platforms 16b are collectively used as an electroplating electrode. Referring now to FIGS. 2E-2F, the fourth plating template 18b is removed to expose the second metal seed layer 12b. Exposed portions of the second metal seed layer 12b are then removed (i.e., stripped) to expose the underlying surface of the second semiconductor wafer 10b, and define second metal seed layer patterns 12b' and a second plurality of bonding sites (regions 16b and 20b) thereon.

Figure 3A:
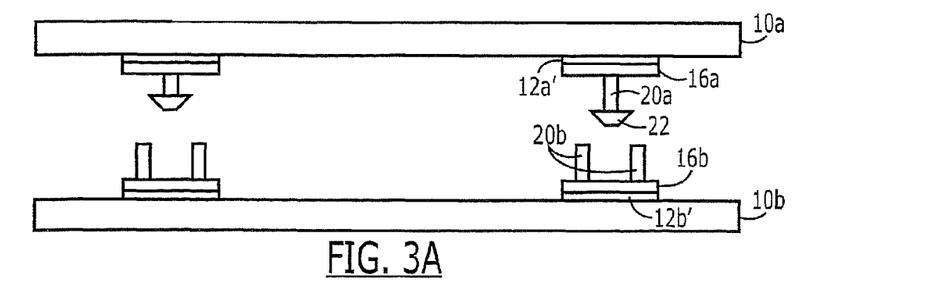
FIGS. 3A-3B are cross-sectional views of intermediate structures that illustrate methods of forming a multi-chip semiconductor substrate, according to embodiments of the present invention.
Figure 3B:
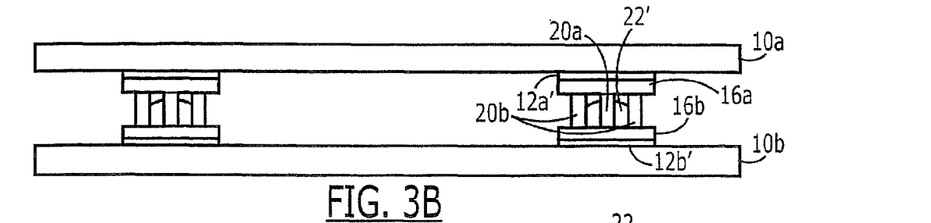

A two-chip semiconductor substrate can be formed by bonding the first semiconductor wafer 10a, which has a first plurality of bonding sites thereon, to the second semiconductor wafer 10b, which has a second plurality of bonding sites thereon. As illustrated by FIGS. 3A-3B, this bonding step is performed by aligning the first plurality of bonding sites within corresponding ones of the second plurality of bonding sites and then heat treating the first and second pluralities of bonding sites so that each of the first plurality of bonding sites becomes permanently affixed within a corresponding one of the second plurality of bonding sites. In particular, as illustrated by FIG. 3B, each of the first plurality of bonding sites is configured to be matingly received within a corresponding one of the second plurality of bonding sites and then permanently bonded by melting the thermally malleable electrical conductors 22 (at the distal ends of the first plurality of bonding sites), to thereby yield electrically conductive bonds 22' that affix each first bonding site extension 20a within a corresponding second bonding site extension 20b.

Figure 4A:
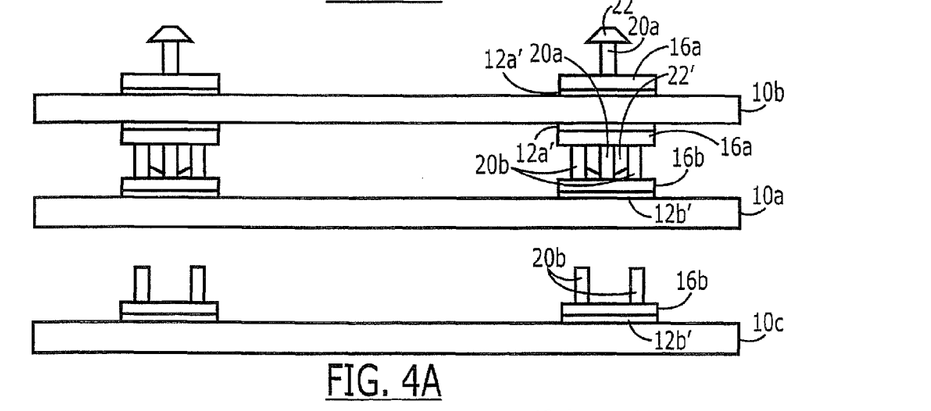
FIGS. 4A-4C are cross-sectional views of intermediate structures that illustrate methods of forming a three-chip semiconductor substrate, according to embodiments of the present invention.
Figure 4B:
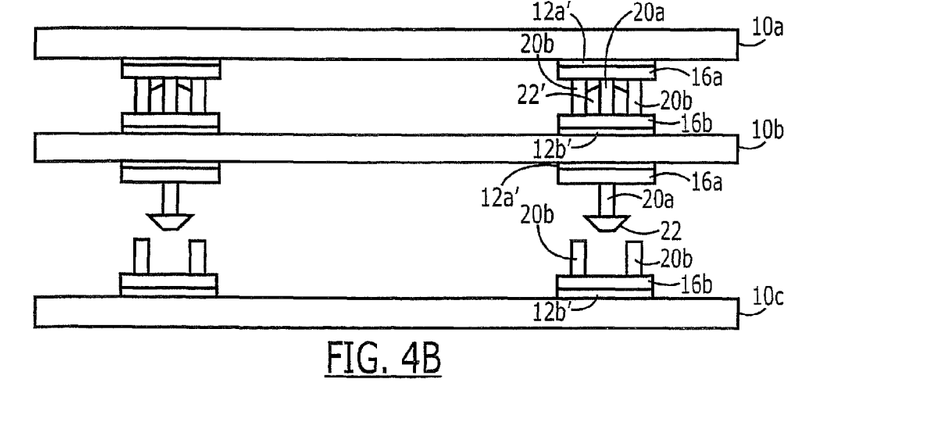
Figure 4C:
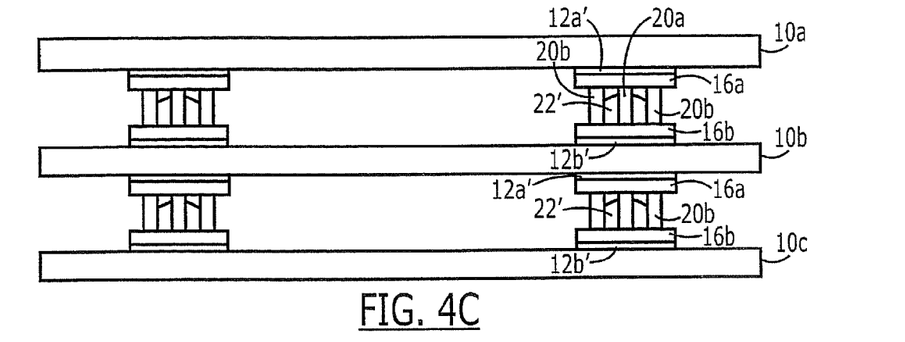

Next, as illustrated by FIG. 4A, the method steps highlighted by FIGS. 1A-1H may be performed to define a third plurality of bonding sites on a second surface of the second semiconductor wafer 10b and the method steps highlighted by FIGS. 2A-2F may be performed to define a fourth plurality of bonding sites on a first surface of a third semiconductor wafer 10c. Finally, using the steps illustrated by FIGS. 3A-3B, the second semiconductor wafer 10b is then bonded to a third semiconductor wafer 10c by aligning the third plurality of bonding sites in mating relationship within corresponding ones of the fourth plurality of bonding sites, as illustrated by FIG. 4B. A heat treating step is then performed on the third and fourth pluralities of bonding sites so that each of the third plurality of bonding sites becomes permanently affixed to a corresponding one of the fourth plurality of bonding sites, as illustrated by FIG. 4C.

Figure 5A:
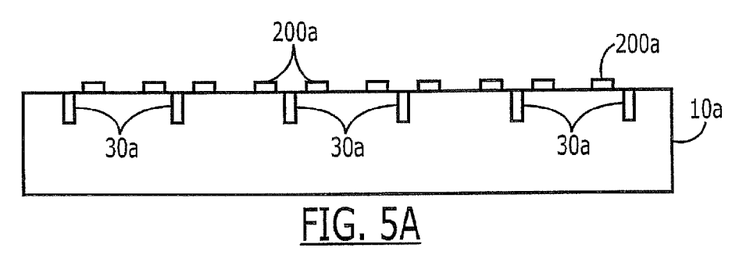
FIGS. 5A-5G are cross-sectional views of intermediate structures that illustrate methods of forming three-chip semiconductor substrates, according to embodiments of the present invention.
Figure 5B:
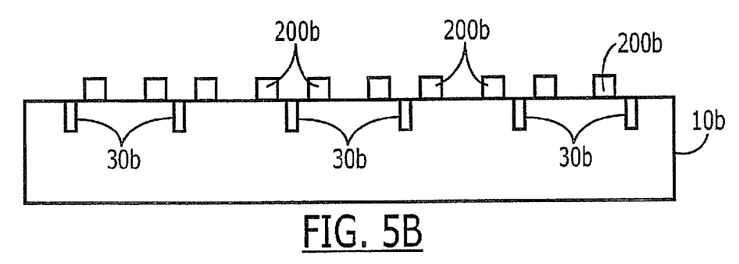

As will now be described with respect to FIGS. 5A-5G, the methods described above with respect FIGS. 1A-1H, FIGS. 2A-2F, FIGS. 3A-3B and 4A-4C may be utilized to generate a plurality of three-chip semiconductor substrates, according to embodiments of the present invention. In particular, according to some embodiments of the invention and as illustrated by FIG. 5A, the methods illustrated by FIGS. 1A-1H may be utilized to define a first plurality of bonding sites 200a on a first surface of a first semiconductor wafer 10a. FIG. 5A further illustrates forming a first plurality of intersecting dicing streets 30a in the first surface of the first semiconductor wafer 10a. These intersecting dicing streets 30a, which may have widths of less than about 15 µm and depths in a range from about 10 µm to about 500 µm, may be formed as a crisscrossing grid of dicing streets that define the lateral dimensions of each multi-chip substrate to be formed. Similarly, the methods illustrated by FIGS. 2A-2F may be utilized to define a second plurality of bonding sites 200b on a first surface of a second semiconductor wafer 10b, as illustrated by FIG. 5B. FIG. 5B further illustrates forming a second plurality of intersecting dicing streets 30b in the first surface of the second semiconductor wafer 10b.

Figure 5C:
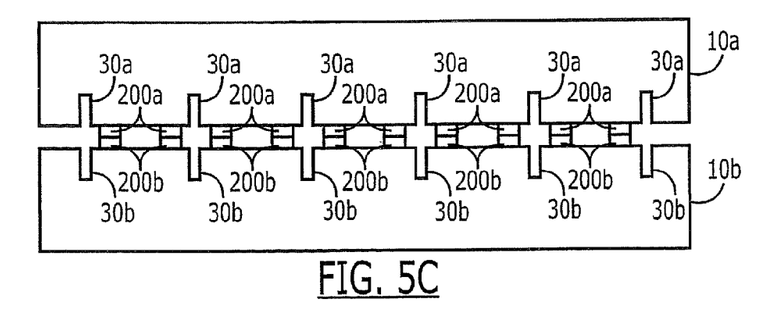
Figure 5D:
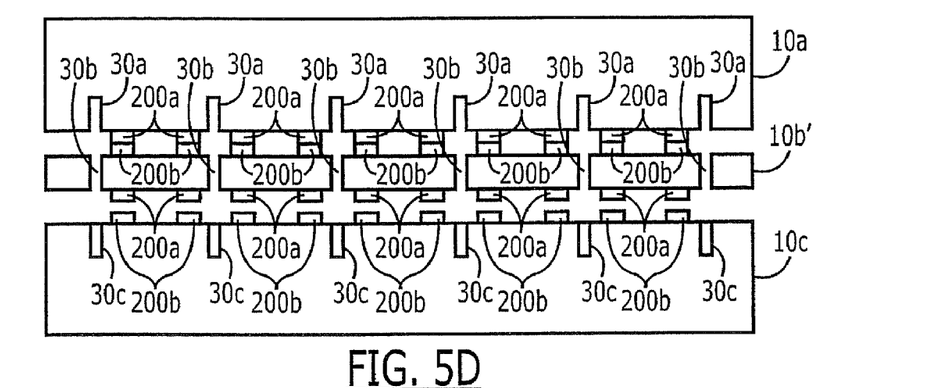

Referring now to FIG. 5C, the first surface of the first semiconductor wafer 10a is bonded to the first surface of the second semiconductor wafer 10b so that the first and second pluralities of intersecting dicing streets 30a, 30b are aligned with each other. According to some embodiments of the invention, the bonding step may be performed as illustrated by FIGS. 3A-3B. Following this bonding step, a second surface of the second semiconductor wafer 10b may be planarized to a sufficient depth to expose bottoms of the second plurality of intersecting dicing streets 30b and thereby define a thinned second semiconductor wafer 10b', as illustrated by FIG. 5D. The methods illustrated by FIGS. 1A-1H may then be utilized to define a first plurality of bonding sites 200a on the planarized second surface of a second semiconductor wafer 10b. In addition, the methods illustrated by FIGS. 2A-2F may be utilized to define a second plurality of bonding sites 200b on a first surface of a third semiconductor wafer 10c.

Figure 5E:
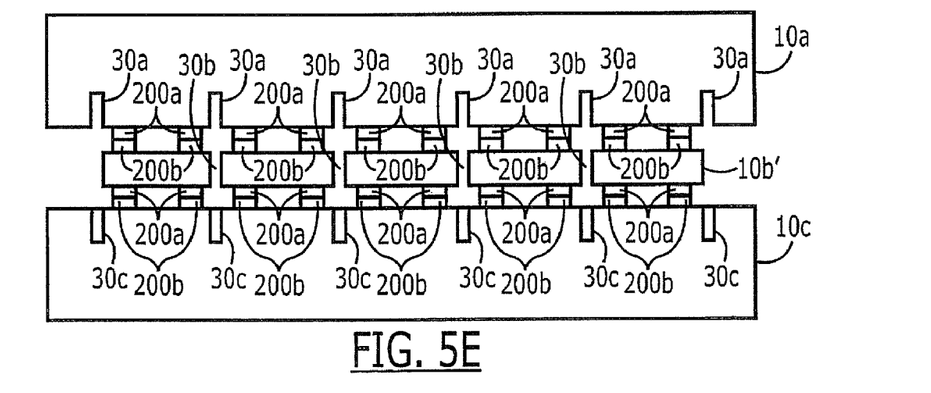
Figure 5F:
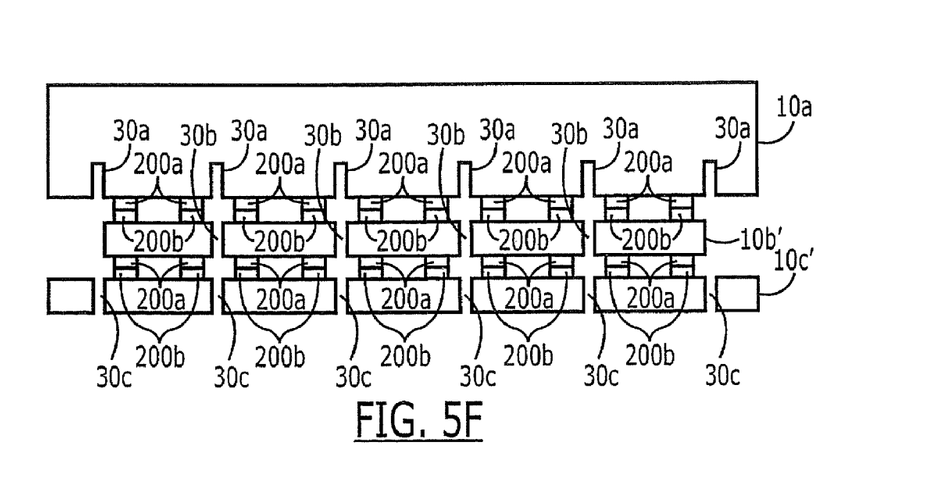
Figure 5G:
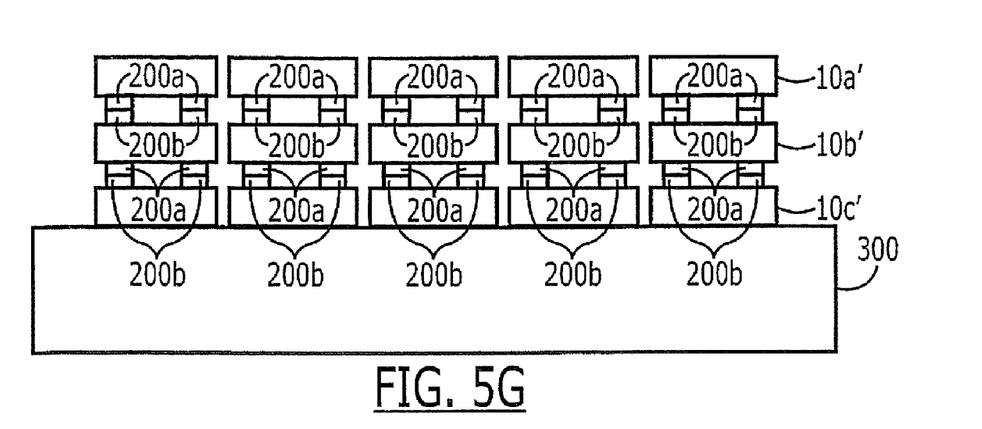

In addition, a third plurality of intersecting dicing streets 30c are formed in the first surface of the third semiconductor wafer 10c, as illustrated by FIG. 5D, and then the first surface of the third semiconductor wafer 10c is bonded to the planarized second surface of the semiconductor wafer 10b, as illustrated by FIG. 5E (and FIG. 4B). Conventional techniques may then be used to planarize and/or selectively etch back portions of the second surfaces of the first and third semiconductor wafers 10a and 10c, to thereby reveal bottoms of the first and third plurality of dicing streets 30a and 30c and thereby define thinned first and third semiconductor wafers 10a' and 10c', which may be separated into a plurality of three-chip semiconductor substrates. In particular, as illustrated by FIG. 5F, the second surface of the third semiconductor wafer 10c may be planarized to reveal bottoms of the dicing streets 30c and then, as illustrated by FIG. 5G, the planarized second surface of the third semiconductor wafer 10c' may be supported on a substrate 300 during a step to planarize a second surface of the first semiconductor wafer 10a' to reveal the dicing streets 30a. According to alternative embodiments of the invention, the step of planarizing the second surface of the first semiconductor wafer 10a' may be replaced by a step to form crisscrossing scribe lines in the second surface that are sufficiently deep to expose bottoms of the dicing streets 30a. According to these embodiments, the first semiconductor wafer 10a' may be sufficiently thicker than the second and third semiconductor wafers 10b' and 10c', when separating these wafers into a plurality of three-chip semiconductor substrates.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A method of forming multi-chip semiconductor substrates, comprising:

forming a first plurality of intersecting dicing streets in a first surface of a first semiconductor wafer having a first plurality of bonding site thereon;

forming a second plurality of intersecting dicing streets in a first surface of a second semiconductor wafer having a second plurality of bonding sites thereon;

bonding the first surface of the first semiconductor wafer to the first surface of the second semiconductor wafer so that the first and second plurality of intersecting dicing streets are aligned with each other and each of the first plurality of bonding sites becomes permanently affixed within a corresponding one of the second plurality of bonding sites; and then removing portions of a second surface of the second semiconductor wafer to expose bottoms of the second plurality of intersecting dicing streets and thereby define a plurality of bonded pairs of semiconductor chips.

2. The method of claim 1, further comprising packaging at least one of the plurality of bonded pairs of chips as a multi-chip module.

3. The method of claim 1, wherein said removing step is preceded by:

planarizing a second surface of the first semiconductor wafer to a sufficient depth to expose bottoms of the first plurality of intersecting dicing streets.

4. The method of claim 3, further comprising:

forming a third plurality of intersecting dicing streets in a first surface of a third semiconductor wafer; and bonding the first surface of the third semiconductor wafer to the planarized second surface of the first semiconductor wafer so that the first and third plurality of intersecting dicing streets are aligned with each other.

5. The method of claim 4, further comprising:

planarizing a second surface of the third semiconductor wafer to a sufficient depth to expose bottoms of the third plurality of intersecting dicing streets.

6. The method of claim 5, wherein said removing step comprises removing portions of a second surface of the second semiconductor wafer to expose bottoms of the second plurality of intersecting dicing streets and thereby define a plurality of bonded three-chip semiconductor substrates.

7. The method of claim 1, wherein said forming a first plurality of intersecting dicing streets comprises forming a first plurality of intersecting dicing streets having widths less than about 15 μm, in a first surface of a first semiconductor wafer.

8. The method of claim 1, wherein said removing comprises chemically-mechanically polishing the second surface of the second semiconductor wafer.

9. The method of claim 1, wherein each of the first plurality of bonding sites is configured to be matingly received within a corresponding one of the second plurality of bonding sites.

10. The method of claim 9, wherein each of the first plurality of bonding sites comprises a bonding site extension; and wherein each of the second plurality of bonding sites comprises a bonding site recess into which a corresponding bonding site extension is received during said bonding.

11. The method of claim 10, wherein each bonding site extension within the first plurality of bonding sites comprises a thermally malleable electrical conductor at a distal end thereof.

12. The method of claim 11, wherein the thermally malleable electrical conductor comprises a solder material.

13. The method of claim 10, wherein each bonding site extension within the first plurality of bonding sites comprises a fusible metal alloy having a melting point in a range from about 90° C. to about 450° C.

14. The method of claim 10, wherein each bonding site recess in the second plurality of bonding sites comprises a cylindrically-shaped metal receiver configured to receive a bonding side extension of a corresponding one of the first plurality of bonding sites.

15. The method of claim 9, wherein each of the first plurality of bonding sites has a T-shaped cross-section; and wherein each of the second plurality of bonding sites has a U-shaped cross-section.

* * * * *